United States Patent
Fu et al.

(10) Patent No.: US 11,843,081 B2
(45) Date of Patent: Dec. 12, 2023

(54) DISPLAY PANEL AND FABRICATION METHOD, AND DISPLAY DEVICE FOR DISPLAYING MULTIPLE IMAGES AT DIFFERENT VIEWING ANGLES

(71) Applicant: Xiamen Tianma Micro-Electronics Co., Ltd., Xiamen (CN)

(72) Inventors: Jujian Fu, Shanghai (CN); Gang Liu, Shanghai (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 303 days.

(21) Appl. No.: 17/348,110

(22) Filed: Jun. 15, 2021

(65) Prior Publication Data
US 2022/0320385 A1    Oct. 6, 2022

(30) Foreign Application Priority Data

Mar. 31, 2021    (CN) .......................... 202110350808.2

(51) Int. Cl.
*H01L 33/58*    (2010.01)
*H01L 25/075*   (2006.01)
*H01L 33/60*    (2010.01)

(52) U.S. Cl.
CPC .......... *H01L 33/58* (2013.01); *H01L 25/0753* (2013.01); *H01L 33/60* (2013.01); *H01L 2933/0058* (2013.01)

(58) Field of Classification Search
CPC .......... H10K 2102/3031; H10K 59/50; H10K 59/126; H01L 33/58; H01L 25/0753; H01L 33/60; H01L 2933/0058
See application file for complete search history.

(56) References Cited

U.S. PATENT DOCUMENTS

| 2020/0126955 A1* | 4/2020 | Chen ........................ H01L 33/58 |
| 2020/0388599 A1* | 12/2020 | Chen ........................ H01L 33/58 |
| 2021/0367022 A1* | 11/2021 | Tang ................... H10K 59/1213 |
| 2022/0209175 A1* | 6/2022 | Tian ....................... H10K 50/828 |
| 2022/0262995 A1* | 8/2022 | Li ............................. H01L 33/60 |

FOREIGN PATENT DOCUMENTS

| CN | 109285858 A | 1/2019 |
| WO | 2006100950 A1 | 9/2006 |

OTHER PUBLICATIONS

WO_2006100950_A1_machine translation, 2006 (Year: 2006).*
Xiao,CN109285858A_ machine translation, 2019 (Year: 2019).*
China First Office Action_2022 (Year: 2022).*

* cited by examiner

*Primary Examiner* — Tracie Y Green
(74) *Attorney, Agent, or Firm* — ANOVA LAW GROUP PLLC

(57) ABSTRACT

A display panel and a fabrication method, and a display device are provided. The display panel includes a substrate, and a plurality of sub-pixels disposed on the substrate. Each sub-pixel includes a light-emitting element and a light-shielding structure corresponding to the light-emitting element. The plurality of sub-pixels are divided into N types, wherein N is an integer greater than or equal to two. For light-emitting elements in sub-pixels of different types of the plurality of sub-pixels, light-shielding structures are disposed in different directions of corresponding light-emitting elements, and light-emitting directions of the sub-pixels of different types are different.

20 Claims, 13 Drawing Sheets

DISPLAY PANEL AND FABRICATION METHOD, AND DISPLAY DEVICE FOR DISPLAYING MULTIPLE IMAGES AT DIFFERENT VIEWING ANGLES

CROSS-REFERENCE TO RELATED APPLICATION

This application claims the priority of Chinese patent application No. 202110350808.2, filed on Mar. 31, 2021, the entirety of which is incorporated herein by reference.

FIELD

The present disclosure generally relates to the field of display technology and, more particularly, relates to a display panel and a fabrication method, and a display device.

BACKGROUND

With the continuous improvement of production and living standards, users have increased demand for displays. In many cases, a single display can hardly meet the needs of specific scenes, while the extended use of two or more displays not only increases the cost, but also places substantially high demands on display space.

SUMMARY

One aspect of the present disclosure provides a display panel. The display panel includes a substrate, and a plurality of sub-pixels disposed on the substrate. Each sub-pixel includes a light-emitting element and a light-shielding structure corresponding to the light-emitting element. The plurality of sub-pixels are divided into N types, where N is an integer greater than or equal to two. For light-emitting elements in sub-pixels of different types of the plurality of sub-pixels, light-shielding structures are disposed in different directions of corresponding light-emitting elements, and light-emitting directions of the sub-pixels of different types are different.

Another aspect of the present disclosure provides a fabrication method of a display panel. The method includes providing a substrate, and forming a plurality of sub-pixels on the substrate. Each sub-pixel includes a light-emitting element and a light-shielding structure corresponding to the light-emitting element. The plurality of sub-pixels are divided into N types, where N is an integer greater than or equal to two. For light-emitting elements in sub-pixels of different types of the plurality of sub-pixels, light-shielding structures are disposed in different directions of corresponding light-emitting elements, and light-emitting directions of the sub-pixels of different types are different.

Another aspect of the present disclosure provides a display device. The display device includes a display panel. The display panel includes a substrate, and a plurality of sub-pixels disposed on the substrate. Each sub-pixel includes a light-emitting element and a light-shielding structure corresponding to the light-emitting element. The plurality of sub-pixels are divided into N types, where N is an integer greater than or equal to two. For light-emitting elements in sub-pixels of different types of the plurality of sub-pixels, light-shielding structures are disposed in different directions of corresponding light-emitting elements, and light-emitting directions of the sub-pixels of different types are different.

Other aspects of the present disclosure can be understood by those skilled in the art in light of the description, the claims, and the drawings of the present disclosure.

BRIEF DESCRIPTION OF THE DRAWINGS

To more clearly illustrate the embodiments of the present disclosure, the drawings will be briefly described below. The drawings in the following description are certain embodiments of the present disclosure, and other drawings may be obtained by a person of ordinary skill in the art in view of the drawings provided without creative efforts.

DETAILED DESCRIPTION OF THE DISCLOSURE

Reference will now be made in detail to exemplary embodiments of the disclosure, which are illustrated in the accompanying drawings. Wherever possible, the same reference numbers will be used throughout the drawings to refer to the same or the alike parts. The described embodiments are some but not all of the embodiments of the present disclosure. Based on the disclosed embodiments, persons of ordinary skill in the art may derive other embodiments consistent with the present disclosure, all of which are within the scope of the present disclosure.

Similar reference numbers and letters represent similar terms in the following Figures, such that once an item is defined in one Figure, it does not need to be further discussed in subsequent Figures.

Figure 1:
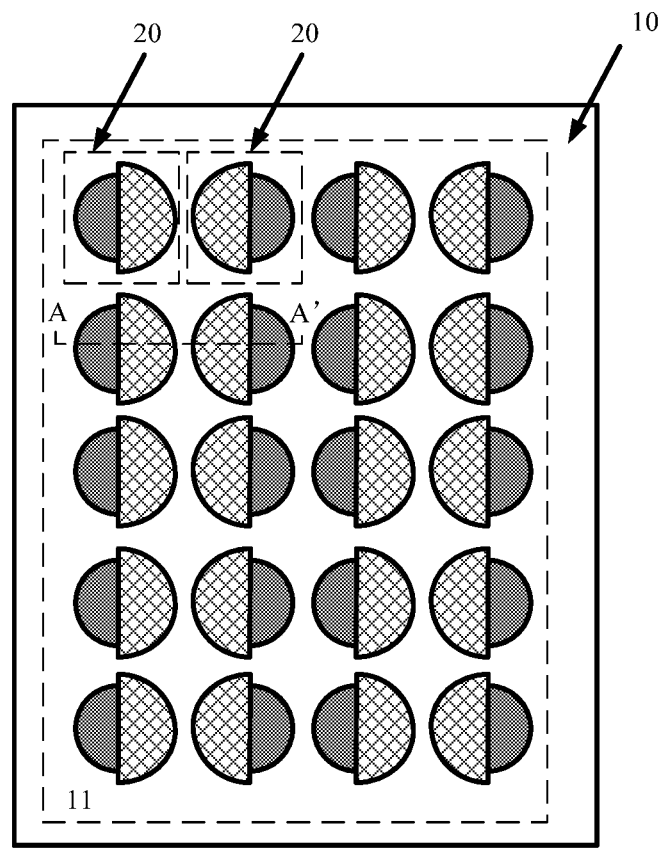
FIG. 1 illustrates a schematic top view of an exemplary display panel consistent with disclosed embodiments of the present disclosure.
Figure 2:
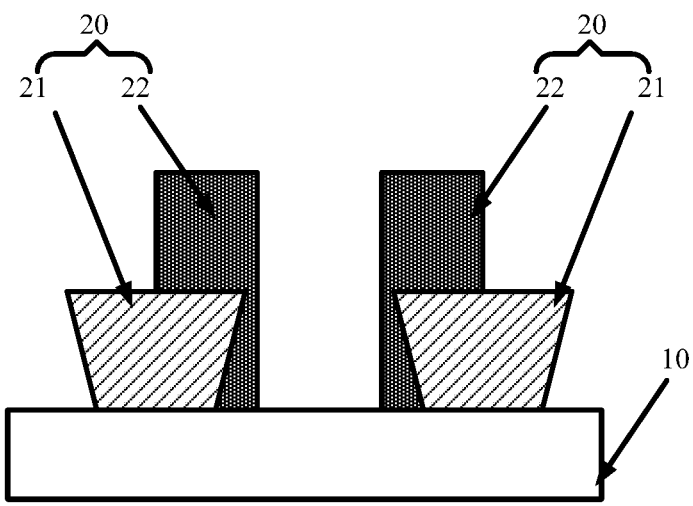
FIG. 2 illustrates a schematic AA'-sectional view of an exemplary display panel in FIG. 1 consistent with disclosed embodiments of the present disclosure.

The present disclosure provides a display panel. FIG. 1 illustrates a schematic top view of a display panel; and FIG. 2 illustrates a schematic AA'-sectional view of the display panel in FIG. 1. Referring to FIG. 1, the display panel may include a substrate 10, and a plurality of sub-pixels 20 disposed on the substrate 10. A sub-pixel 20 may include a light-emitting element 21 and a light-shielding structure 22 corresponding to the light-emitting element 21.

The plurality of sub-pixels 20 may be divided into N types, and N may be an integer greater than or equal to two. For light-emitting elements in the sub-pixels 20 of different types, the light-shielding structures 22 may be disposed in different directions of the corresponding light-emitting elements 21, such that the light-emitting directions of the sub-pixels 20 of different types may be different.

Figure 3:
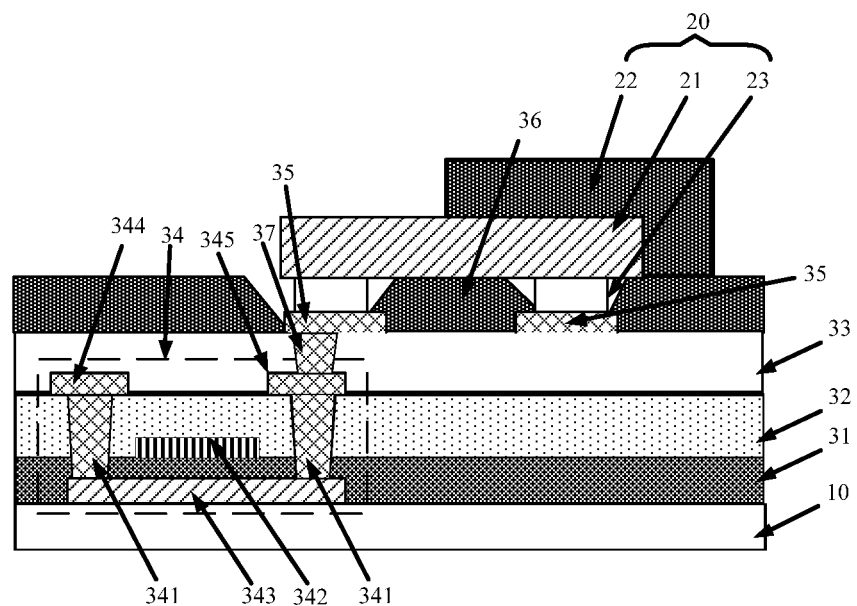
FIG. 3 illustrates a schematic cross-sectional view of an exemplary display panel consistent with disclosed embodiments of the present disclosure.

To clearly and concisely illustrate the relative positional relationship between the light-emitting element 21 and the light-shielding structure 22 in each sub-pixel 20, FIG. 1 and FIG. 2 may not illustrate any other film layer disposed between the substrate 10 and the sub-pixels 20. FIG. 3 illustrates a schematic cross-sectional view of a display panel. Referring to FIG. 3, the display panel may further include a thin film transistor 34 disposed on the substrate 10. A plurality of thin film transistors 34 may form a plurality of pixel circuits. The thin film transistor 34 may include an active layer 343, a gate 342, a source 344 and a drain 345. The source 344 and the drain 345 may be electrically connected to a source region and a drain region of the active layer 343 through first vias 341, respectively.

The sub-pixel 20 may further include a binding structure 23. The binding structure 23 may include structures such as an electrode and a solder layer. The bonding structure 23 may be electrically connected to a bonding pad 35. The bonding pad 35 electrically connected to an anode of the light-emitting element 21 may be electrically connected to the drain 345 of the thin film transistor 34 through a second via 37.

A plurality of insulating layers may be disposed between each layer structure of the thin film transistor and the light-emitting element 21. The plurality of insulating layers may include an interlayer dielectric layer 31, a gate insulating layer 32, a planarization layer 33, and a pixel definition layer 36, etc. In addition, when the display panel further includes a light-shielding layer/a buffer layer disposed between the active layer 343 and the substrate 10, the plurality of insulating layers may further include an insulating layer for isolating the light-shielding layer/the buffer layer from the active layer 343.

When the light-emitting element 21 is a Micro-LED, the structure of the light-emitting element may often include a substrate, and a buffer layer, an N-type contact layer, a light-emitting layer, and a P-type contact layer that are sequentially disposed over the substrate. Further, the light-emitting element may include a P electrode in contact with the P-type contact layer and an N electrode in contact with the N-type contact layer. The light-emitting layer may be a multiple quantum well layer. For GaN-based Micro-LED, the N-type contact layer may be an N-type gallium nitride layer, and the P-type contact layer may be a P-type gallium nitride layer. In addition, in certain embodiments, the light-emitting element 21 may further include an encapsulation film layer. The encapsulation film layer may encapsulate the buffer layer, the N-type contact layer, the light-emitting layer, the P-type contact layer, the P electrode, and the N electrode, to ensure the waterproof and dustproof characteristics of the Micro-LED. The specific structure of the light-emitting element 21 may not be limited by the present disclosure, and may be determined according to practical applications.

FIG. 1 illustrates a case where N may be equal to two. In certain embodiments, N may be any other value. For example, referring to FIG. 4, which illustrates a schematic top-view of the display panel, N may be equal to 4. In other words, the sub-pixels 20 on the substrate 10 may be divided into four types. The different values of N may mean that the quantity of multi-screen displays that the display panel is capable of simultaneously performing display is different. FIG. 5 illustrates a schematic diagram of the display panel performing multi-screen display. When N is equal to two, referring to FIG. 5, the display panel may display up to two display images at the same time. In other words, the user may view one display image at a viewing angle 1 in FIG. 5, and may view another display image at a viewing angle 2 in FIG. 5. When N is equal to two, the display panel may have the ability of simultaneously displaying two images. However, the display panel may not need to simultaneously display two different display images, and the sub-pixels 20 of two types may simultaneously display one display image. Similarly, when N is equal to 4, the display panel may display up to four display images at the same time. In other words, the display panel may have the ability to display up to four different display images at the same time. Optionally, the value of N may be 3, 5, 6, 7, 8, etc., which may not be limited by the present disclosure, and may be determined according to practical applications.

Referring to FIG. 5, the display panel in the present disclosure may allow the user to receive light emitted by sub-pixels 20 of different types at different viewing angles without increasing the quantity of panels, which may lay the foundation for viewing different display images from different viewing angles. In other words, the display panel in the present disclosure may display multiple display images by a single display panel, which may facilitate to reduce the cost of multi-screen display, and to reduce the demands of multi-screen display for display space.

Moreover, when the display panel uses sub-pixels 20 of different types to display different display images, user may merely need to adjust the viewing angle and may not need to wear additional equipment such as polarized glasses, which may facilitate to improve the user convenience.

Figure 6:
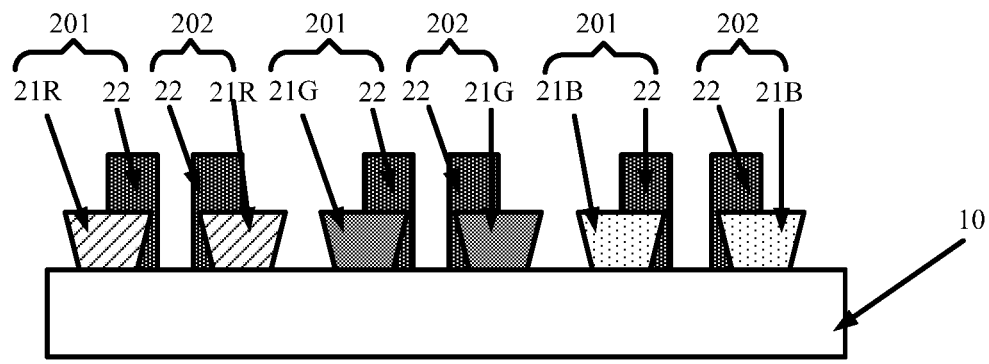
FIG. 6 illustrates a schematic cross-sectional view of another exemplary display panel consistent with disclosed embodiments of the present disclosure.

FIG. 6 illustrates a schematic cross-sectional view of another display panel. In one embodiment, referring to FIG. 6, the sub-pixels 20 of a same type may include light-emitting elements 21 of different colors, and the sub-pixels 20 of the same type may jointly display one image. The sub-pixels 20 of different types may display different display images.

FIG. 6 illustrates sub-pixels 20 of two types including sub-pixels 201 and sub-pixels 202, respectively. The sub-pixels 20 of each type may include light-emitting elements 21 of three different colors. The light-emitting elements 21 of three different colors may include a red light-emitting element 21R, a green light-emitting element 21G, and a blue light-emitting element 21B.

In one embodiment, sub-pixels 201 of one type may jointly display one image, and sub-pixels 202 of another type may jointly display another image, such that the display panel may display two or more different images at the same time. The user may merely need to switch the viewing angles to watch the images displayed by sub-pixels 20 of different types, which may facilitate to simplify the user convenience. In addition, the display panel may also meet the demands of simultaneously viewing different contents by two users.

The data signals of sub-pixels 20 of different types may be provided by a same data driving circuit in time sharing, or may be simultaneously provided by different data driving circuits. The specific method of providing the data signals may be determined according to a frame size of the display panel and the specific driving requirements of the display panel.

Referring to FIG. 6, in one embodiment, at least two sub-pixels that are of different types but emit light of a same color may be adjacently disposed. Such arrangement may make a distance between the sub-pixels that are of different types but emit the light of the same color substantially close. In other words, the distance between the sub-pixels emitting the light of the same color and configured to display different images may be substantially close. Therefore, the difference in parameters such as brightness and color gamut between different images displayed by the sub-pixels of different types may be substantially small, which may facilitate to maintain the consistency of parameters between different display images.

Figure 7:
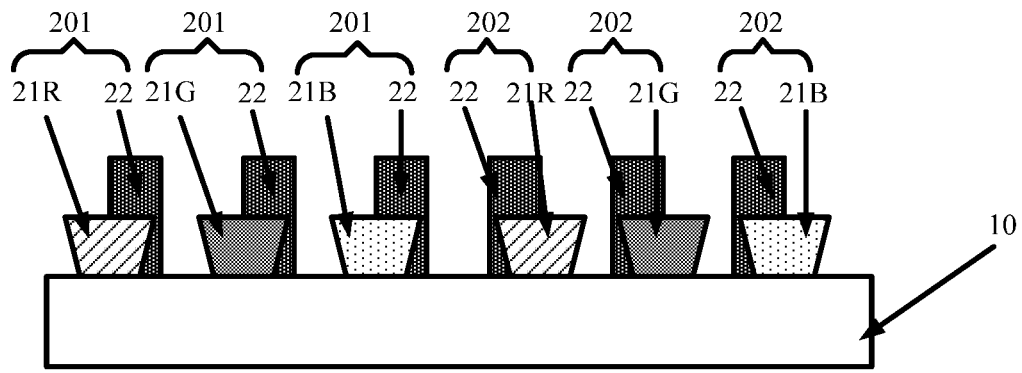
FIG. 7 illustrates a schematic cross-sectional view of another exemplary display panel consistent with disclosed embodiments of the present disclosure.

FIG. 7 illustrates a schematic cross-sectional view of another display panel. Referring to FIG. 7, at least two sub-pixels that are of a same type but emit light of different colors may be adjacently disposed.

In the display panel illustrated in FIG. 7, the distance between the light-emitting elements that emit light of the same color (e.g., between two red light-emitting elements 21R that emit light of red color) may be substantially large, which may reduce the alignment accuracy of binding the light-emitting elements that emit the light of the same color, may facilitate to reduce the difficulty of manufacturing the display panel and to improve the manufacturing yield of the display panel.

In the sub-pixels of different types, the arrangement direction of the light-shielding structure with respect to the corresponding light-emitting element may be parallel to the plane of the display panel. Optionally, referring to FIG. 6 or FIG. 7, in the sub-pixels of different types, the arrangement direction of each light-shielding structure with respect to the corresponding light-emitting element may be parallel to the plane of the display panel. In other words, referring to FIG. 6 and FIG. 7, the light-shielding structure of the sub-pixel 201 of one type may be disposed on the right side of the light-emitting element corresponding to the light-shielding structure along a horizontal direction, and the light-shielding structure of the sub-pixel 202 of another type may be arranged on the left side of the light-emitting element corresponding to the light-shielding structure along the horizontal direction. Both of these two directions may be parallel to the substrate and parallel to the plane of the display panel.

In one embodiment, the arrangement direction of the light-shielding structure with respect to the corresponding light-emitting element may be parallel to the plane of the display panel, which may simplify the positional relationship between the light-shielding structure and the light-emitting element, and may facilitate to control an area ratio of the surface of each light-emitting element covered by the light-shielding structure to be consistent in the process.

Figure 8:
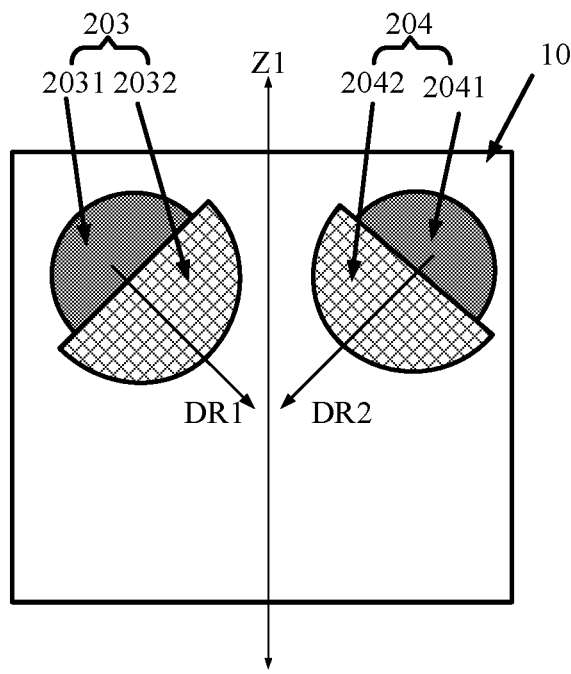
FIG. 8 illustrates a schematic top view of another exemplary display panel consistent with disclosed embodiments of the present disclosure.

FIG. 8 illustrates a schematic top view of another display panel. Referring to FIG. 8, the light-shielding structures of sub-pixels of different types may include a first light-shielding structure 2032 and a second light-shielding structure 2042. The sub-pixels of different types may at least include sub-pixels 203 of a first-type and sub-pixels 204 of a second-type.

The sub-pixels 203 of the first-type may include a first light-emitting element 2031 and the first light-shielding structure 2032. The sub-pixels 204 of the second-type may include a second light-emitting element 2041 and the second light-shielding structure 2042.

The first light-shielding structure 2032 may be disposed on a side of the first light-emitting element 2031 along a first direction DR1, and the second light-shielding structure 2042 may be disposed on a side of the second light-emitting element 2041 along a second direction DR2. The first direction DR1 may intersect the second direction DR2.

For clarity of illustration, FIG. 8 merely illustrates one sub-pixel 203 of the first-type and one sub-pixel 204 of the second-type. In an actual display panel, the quantities of both the sub-pixels 203 of the first-type and the sub-pixels 203 of the second-type may be more than one. FIG. 8 illustrates one pixel, which may facilitate to clearly illustrate the positional relationship between the light-shielding structures and the light-emitting elements in the sub-pixels of different types, as well as the relationship between the first direction DR1 and the second direction DR2.

In one embodiment, by adjusting the positional relationship between the first direction DR1 and the second direction DR2, the size and position of viewing angles of different images displayed on the display panel may be adjusted. The first direction DR1 may intersect the second direction DR2, which may facilitate the research and development designer to determine the positional relationship between the first direction DR1, the second direction DR2 and the viewing angles of displaying different images.

Figure 9:
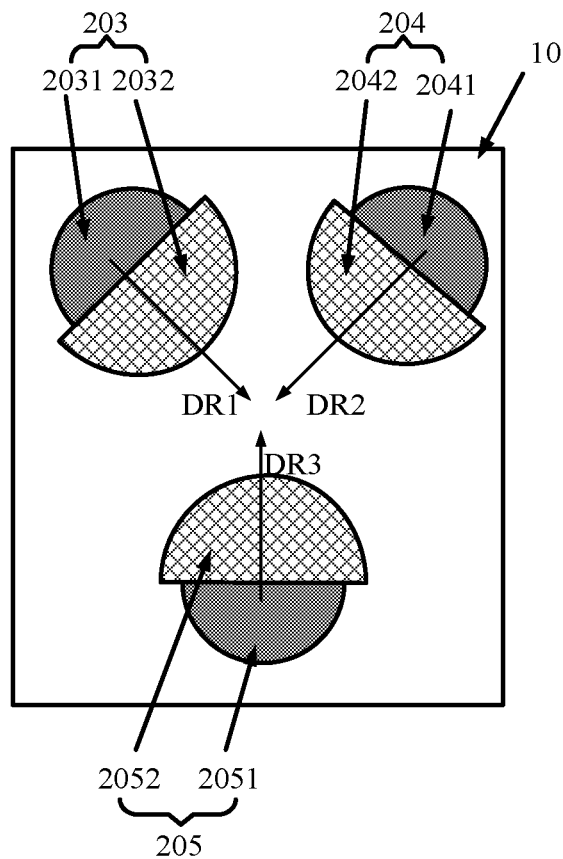
FIG. 9 illustrates a schematic top view of another exemplary display panel consistent with disclosed embodiments of the present disclosure.

FIG. 9 illustrates a schematic top view of another display panel. On the basis of the embodiment associated with FIG. 8, referring to FIG. 9, the light-shielding structures may further include a third light-shielding structure 2052. The sub-pixels may further include sub-pixels 205 of a third-type. The sub-pixel 205 of the third-type may include a third light-emitting element 2051 and the third light-shielding structure 2052.

The third light-shielding structure 2052 may be disposed on a side of the third light-emitting element 2051 along a third direction DR3. The third direction DR3 may be different from the first direction DR1 and the second direction DR2.

FIG. 9 illustrates a schematic diagram of the relative positional relationship between the light-emitting elements and the light-shielding structures of sub-pixels of each type when the sub-pixels are divided into three types. Referring to FIG. 9, when the sub-pixels are divided into three types, and the arrangements of the light-shielding structures of sub-pixels of the three types with respect to the corresponding light-emitting elements are different from each other (in other words, the first direction DR1, the second direction DR2, and the third direction DR3 are different from each other), the display panel may display up to three different images at the same time, and the user may watch different images by adjusting the viewing angles.

Optionally, in one embodiment, referring to FIG. 9, the first direction DR1, the second direction DR2, and the third direction DR3 may be parallel to a same plane. When the first direction DR1, the second direction DR2, and the third direction DR3 are parallel to the same plane, the research and development designer may easily adjust the display viewing angles of different images by adjusting the first direction DR1, the second direction DR2, and the third direction DR3. Optionally, the first direction DR1, the second direction DR2, and the third direction DR3 may not be parallel to the same plane, to satisfy the arrangements of the light-shielding structures corresponding to the special-shaped light-emitting elements, which may not be limited by the present disclosure, and may be determined according to practical applications.

Figure 4:
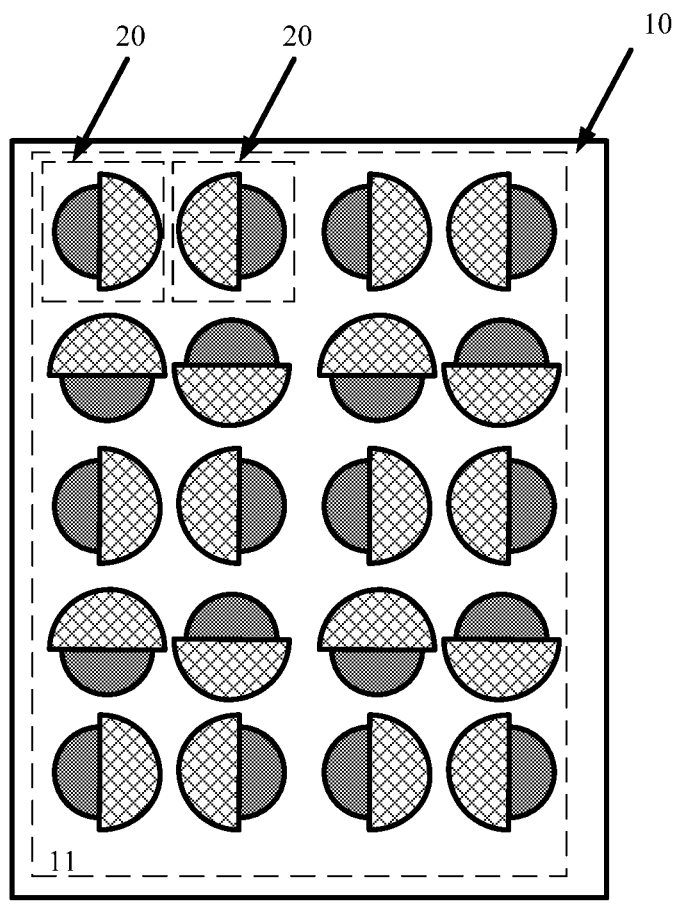
FIG. 4 illustrates a schematic top view of another exemplary display panel consistent with disclosed embodiments of the present disclosure.
Figure 5:
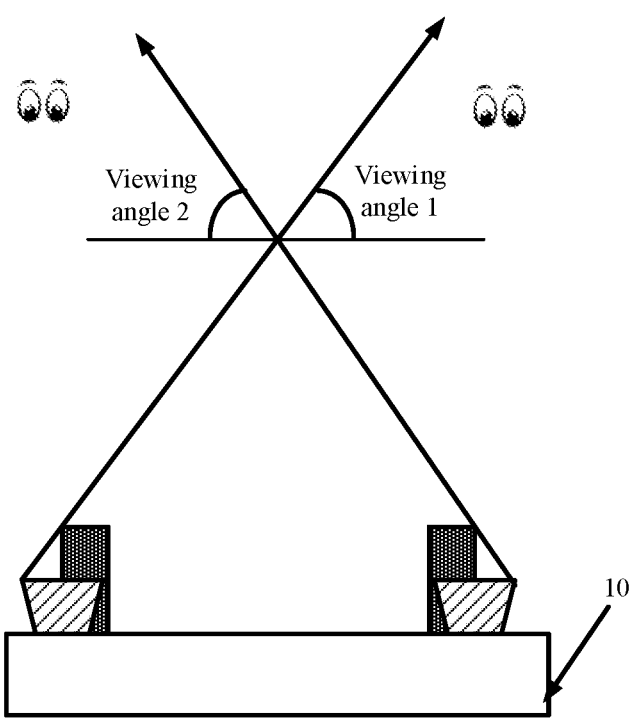
FIG. 5 illustrates a schematic diagram of a display effect of an exemplary display panel consistent with disclosed embodiments of the present disclosure.

Optionally, referring to FIG. 1 or FIG. 4, the substrate 10 may include a display region 11. The sub-pixels 20 of the same type may be uniformly disposed in the display region 11.

The uniformly disposed sub-pixels 20 of the same type may facilitate to make the display parameters such as the brightness and color gamut of each region of the image displayed by the sub-pixels 20 of the same type consistent, and to avoid the problem of different brightness or other parameters in different regions of the same image.

Figure 10:
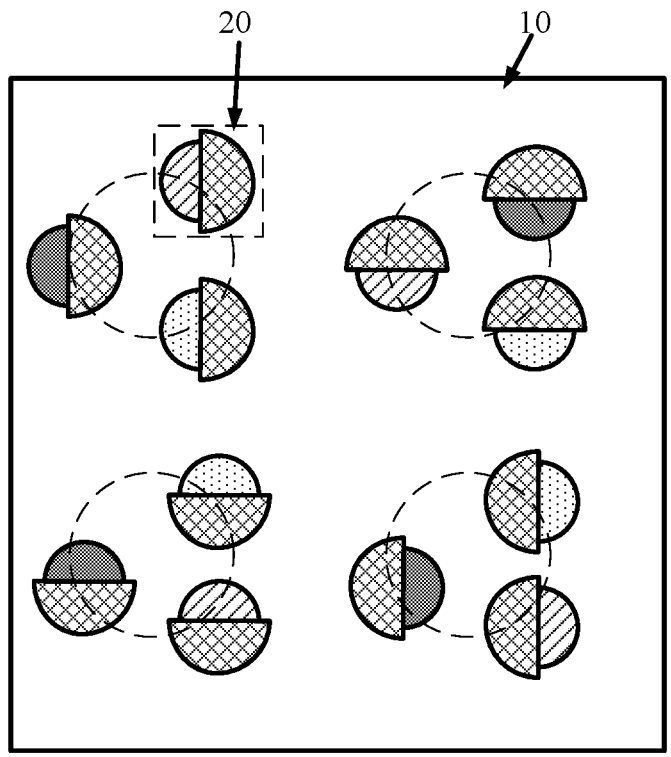
FIG. 10 illustrates a schematic top view of another exemplary display panel consistent with disclosed embodiments of the present disclosure.
Figure 11:
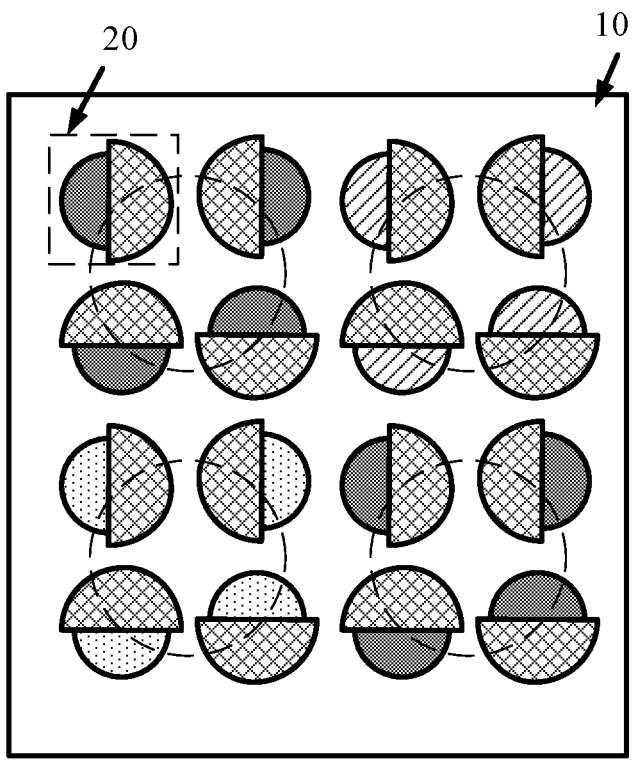
FIG. 11 illustrates a schematic top view of another exemplary display panel consistent with disclosed embodiments of the present disclosure.

FIG. 10 and FIG. 11 each illustrates a schematic diagram of a top view of another display panel. Specifically, referring to FIG. 10, the light-emitting elements of different colors in the sub-pixels 20 of the same type may together form a preset regular pattern. Referring to FIG. 11, the light-emitting elements of the same color in the sub-pixels 20 of different types may together form a preset regular pattern.

Optionally, the preset regular pattern may include but may not be limited to a circle, a rectangle, an ellipse, and a rhombus. In FIG. 10 and FIG. 11, the preset regular pattern may be a circle as an example for description.

Referring to FIG. 10, when the light-emitting elements of different colors in the sub-pixels 20 of the same type together form the preset regular pattern, the sub-pixels 20 of the same type may meet the requirements of arrangement of different pixels by themselves. For example, the sub-pixels 20 of the same type may be arranged in a diamond arrangement, which may reduce the pixel loss of sub-pixels 20 of such type in the arrangement. At the same time, the distance between the light-emitting elements that emit light of the same color may be substantially large, which may reduce the alignment accuracy of binding the light-emitting elements that emit the light of the same color, may facilitate to reduce the difficulty of manufacturing the display panel, and to improve the manufacturing yield of the display panel.

Referring to FIG. 11, when the light-emitting elements of the same color in the sub-pixels 20 of different types together form the preset regular pattern, the distance between the sub-pixels that are of different types but emit light of a same color may be substantially small. In other words, the distance between the sub-pixels that emit light of the same color and are configured to display different images may be substantially small, such that the difference in parameters such as brightness and color gamut, etc., of different images displayed by sub-pixels of different types may be substantially small, which may facilitate to maintain consistency of the parameters of different display images.

Optionally, in one embodiment, referring to FIG. 1 and FIG. 2, the light-emitting elements 21 in the sub-pixels 20 of different types may have a same structure while different arrangement directions.

Specifically, the light-emitting elements 21 having the same structure may mean that the corresponding respective layer structures of the light-emitting elements 21 may be the same. Taking the Micro-LED as an example, the structure of each light-emitting element 21 may include the substrate, and the buffer layer, the N-type contact layer, the light-emitting layer, the P-type contact layer, the P electrode in contact with the P-type contact layer, and the N electrode in contact with the N-type contact layer that are sequentially disposed over the substrate.

In one embodiment, because the light-emitting elements 21 in the sub-pixels 20 have the same structure, the light-emitting elements 21 of the sub-pixels 20 may be uniformly manufactured. When being transferred onto the substrate, the light-emitting elements 21 may be placed in different directions to form the sub-pixels 20 of different types, which may facilitate to simplify the manufacturing process of the display panel.

When the P electrode and the N electrode of the light-emitting element 21 are disposed on a same side of the substrate, the placement direction may refer to the direction in which the P electrode is located with respect to the N electrode. In addition, for light-emitting element 21 in the sub-pixel of any type, the placement direction may also refer to the direction in which the light-shielding structure 22 is located with respect to the corresponding light-emitting element 21. In other words, referring to FIG. 8, the placement direction of the sub-pixel 203 of the first-type may be the first direction DR1, and the placement direction of the sub-pixel 204 of the second-type may be the second direction DR2.

Optionally, referring to FIG. 8, the sub-pixels may include sub-pixels 203 of the first-type and sub-pixels 204 of the second-type. The light-emitting element 2031 of the sub-pixel 203 of the first-type and a light-emitting element 2041 of an adjacent sub-pixel 204 of the second-type may be symmetric with respect to a first axis Z1. The first axis Z1 may be parallel to the surface of the substrate 10.

In one embodiment, the light-emitting element 2031 of the sub-pixel 203 of the first-type and the light-emitting element 2041 of the adjacent sub-pixel 204 of the second-type may be axisymmetric with respect to the first axis Z1. Therefore, the respective light-emitting elements of the sub-pixel 203 of the first-type and the sub-pixel 204 of the second-type disposed in such manner may be uniformly manufactured and then uniformly transferred to the substrate 10. The light-emitting element 2031 of the sub-pixel 203 of the first-type and the light-emitting element 2041 of the sub-pixel 204 of the second-type may merely need to be symmetric with respect to the first axis Z1 during the transfer process, which may facilitate to simplify the manufacturing process of the display panel.

It should be noted that, in the disclosed embodiments associated with FIGS. 1-11, the light-shielding structure 22 may cover a portion of the top surface of the light-emitting element 21. In other words, the light-shielding structure 22 may be extended from a side surface of the light-emitting element 21 and may cover a portion of the top surface of the light-emitting element 21 close to the side surface. The top surface of the light-emitting element 21 may be a surface of the light-emitting element 21 facing away from the substrate 10.

In such arrangement, a height of the light-shielding structure 22 above the top surface of the light-emitting element 21 may not need to be too high, and the light emitted from the light-emitting element 21 in partial directions may be blocked.

Figure 12:
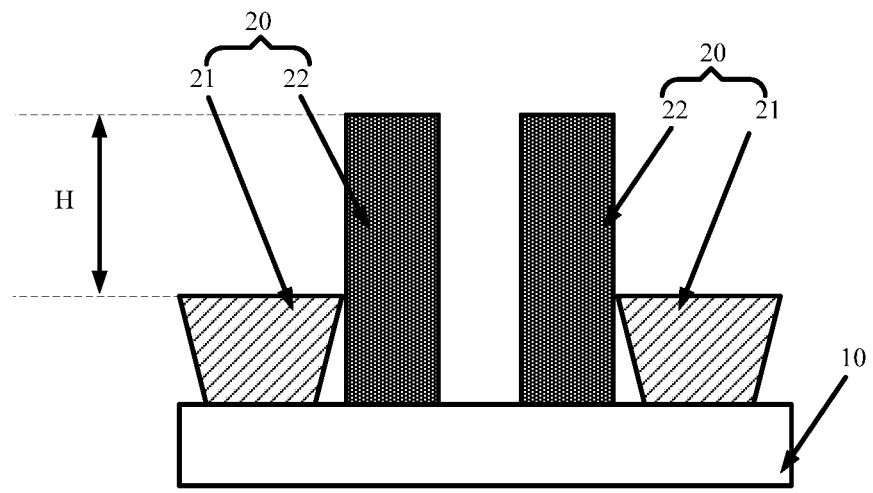
FIG. 12 illustrates a schematic cross-sectional view of another exemplary display panel consistent with disclosed embodiments of the present disclosure.

FIG. 12 illustrates a schematic cross-sectional view of another display panel. In certain embodiments, referring to FIG. 12, the light-shielding structure 22 may not cover the top surface of the light-emitting element 21. In view of this, the height H of the light-shielding structure 22 above the top surface of the light-emitting element 21 may be correspondingly higher, to meet the requirements for blocking the light emitted from the light-emitting element 21 in partial directions.

More specifically, a ratio of an area of a portion of the top surface of the light-emitting element 21 covered by the light-shielding structure 22 over a total area of the top surface of the light-emitting element 21 may be in a range of approximately 0%-50%. For example, the ratio of the area of the portion of the top surface of the light-emitting element 21 covered by the light-shielding structure 22 over the total area of the top surface of the light-emitting element 21 may be 0% (e.g., FIG. 12), 5%, 10%, 20%, 30%, 40%, or 50% (e.g., FIG. 1, FIG. 4, etc.), etc., which may not be limited by the present disclosure.

When the ratio of the area of the portion of the top surface of the light-emitting element 21 covered by the light-shielding structure 22 over the total area of the top surface of the light-emitting element 21 is 50%, and the top surface of the light-emitting element 21 has a circular shape, an orthographic projection of a portion of the light-shielding structure 22 covering the top surface of the light-emitting element 21 on the substrate 10 may have a semicircular shape, and the portion of the light-emitting element 21 exposed by the light-shielding structure 22 may have a semicircular shape.

The top surface of the light-emitting element 21 may have a circular shape, which may facilitate to improve the uniformity of light emitted by the light-emitting element 21 in various directions. The orthographic projection of the light-shielding structure 22 covering the top surface of the light-emitting element 21 on the substrate 10 may have a semicircular shape, which may facilitate to minimize an area occupied by the light-shielding structure 22 on the basis of achieving the light-shielding function of the light-shielding structure 22.

Figure 13:
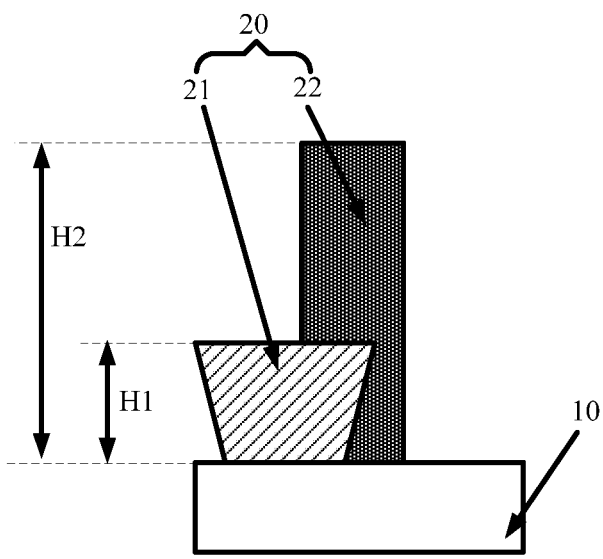
FIG. 13 illustrates a schematic cross-sectional view of another exemplary display panel consistent with disclosed embodiments of the present disclosure.

FIG. 13 illustrates a schematic cross-sectional view of another display panel. Referring to FIG. 13, the height H2 of the light-shielding structure 22 may be greater than a height H1 of the light-emitting element 21. The height H2 of the light-shielding structure 22 may include a distance between a surface of the light-shielding structure 22 facing away from the substrate 10 and the substrate 10, and the height H1 of the light-emitting element 21 may include a distance between a surface of the light-emitting element 21 facing away from the substrate 10 and the substrate 10.

As mentioned above, the light-shielding structure 22 above the top surface of the light-emitting element 21 may facilitate to substantially comprehensively and effectively shield the light emitted from the light-emitting element 21 in partial directions, such that the light-emitting directions of the sub-pixels 20 of various types may be different.

Figure 14:
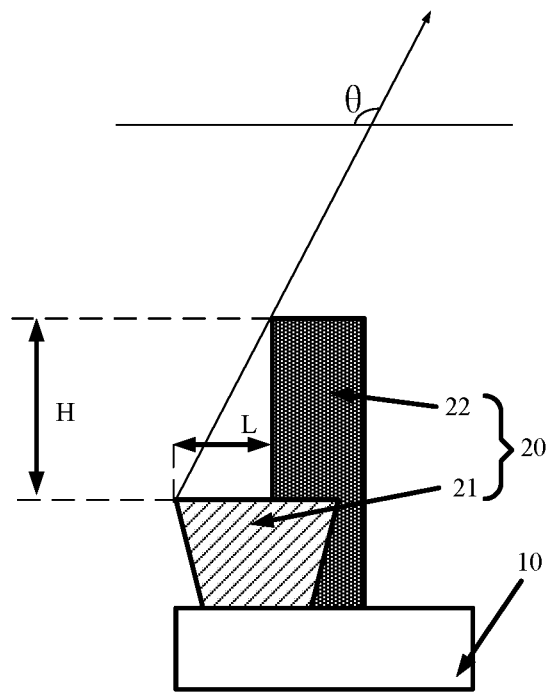
FIG. 14 illustrates a schematic cross-sectional view of another exemplary display panel consistent with disclosed embodiments of the present disclosure.

FIG. 14 illustrates a schematic cross-sectional view of another display panel. In one embodiment, more specifically, referring to FIG. 14, in a cross-section of the sub-pixel 20 that is perpendicular to the surface of the substrate 10 and perpendicular to a boundary line between the light-shielding structure 22 and the top surface of the light-emitting element 21 exposed by the light-shielding structure, the difference between the height of the light-shielding structure 22 and the height of the light-emitting element 21, a length of the portion of the top surface of the light-emitting element 21 not covered by the light-shielding structure 22, and a preset viewing angle may meet a preset formula.

The height of the light-shielding structure 22 may include the distance between the surface of the light-shielding structure 22 facing away from the substrate 10 and the substrate 10. The height of the light-emitting element 21 may include the distance between the surface of the light-emitting element 21 facing away from the substrate 10 and the substrate 10. The top surface of the light-emitting element 21 may include the surface of the light-emitting element 21 facing away from the substrate.

The preset formula may include $$\tan\theta = \left|\frac{H}{L}\right|,$$

where θ may represent the preset viewing angle, and the preset viewing angle may be greater than 90°; H may represent the difference between the height of the light-shielding structure 22 and the height of the light-emitting element 21; and L may represent the length of the portion of the top surface of the light-emitting element 21 not covered by the light-shielding structure 22.

In one embodiment, the difference between the height of the light-shielding structure 22 and the height of the light-emitting element 21, the length of the portion of the top surface of the light-emitting element 21 not covered by the light-shielding structure 22, and the preset viewing angle may meet the preset formula, which may enable research/development designers to easily determine the relationship between the light-emitting element 21, the light-shielding structure 22 and the preset viewing angle in the sub-pixels 20 of each type according to the preset formula, thereby reducing the design difficulty of the display panel.

Figure 15:
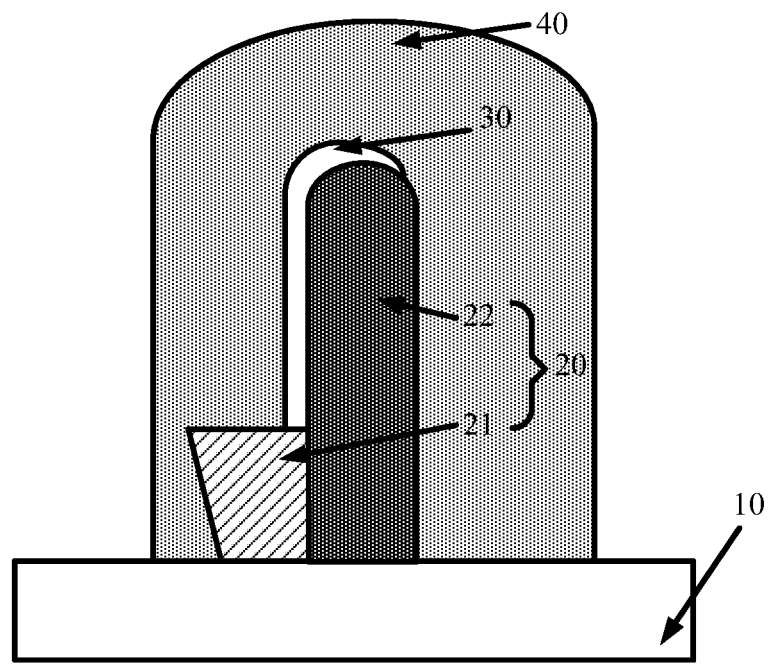
FIG. 15 illustrates a schematic cross-sectional view of another exemplary display panel consistent with disclosed embodiments of the present disclosure.

FIG. 15 illustrates a schematic cross-sectional view of another display panel. On the basis of the foregoing embodiment, in one embodiment, referring to FIG. 15, the sub-pixel may further include a reflection structure 30. The light-shielding structure 22 may include a first portion covering the sidewall of the light-emitting element 21, and a second portion above the top surface of the light-emitting element 21 and facing toward a light-emitting surface of the display panel. The reflection structure 30 may at least cover a sidewall of the second portion facing the corresponding light-emitting element 21.

In one embodiment, the reflection structure 30 may be configured to increase the reflection of the light emitted from the light-emitting element 21 to the light-shielding structure 22, which may facilitate to improve the light-emitting utilization rate of the light-emitting element 21.

Optionally, referring to FIG. 15, an end surface of the second portion may have a convex arc shape. The reflection structure 30 may include an arc portion covering the end surface of the second portion.

In one embodiment, the end surface of the second portion may have a convex arc shape, and the portion of the reflection structure 30 covering the second portion may have an arc shape, which may facilitate to prevent the reflection structure 30 from focusing the reflected light on a certain direction to form a flare, thereby optimizing the display effect on the basis of improving the light-emitting efficiency of the light-emitting element 21.

Optionally, referring to FIG. 15, the sub-pixel 20 may further include an encapsulation layer 40. The encapsulation layer may encapsulate the light-emitting element 21, the light-shielding structure 22, and the reflection structure 30 together, which may facilitate to improve the waterproof and dust-proof performance of the sub-pixel 20.

Figure 16:
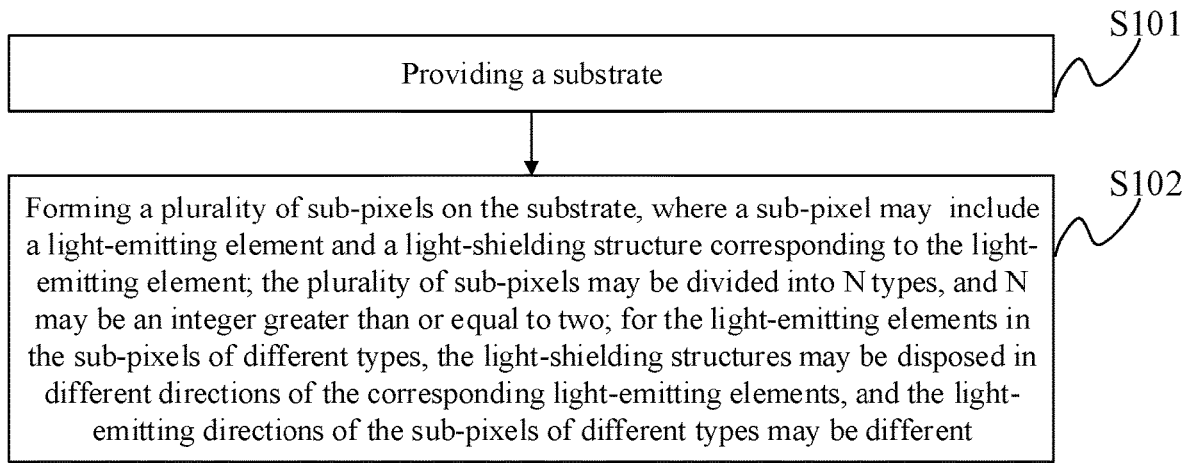
FIG. 16 illustrates a schematic flowchart of an exemplary fabrication method of a display panel consistent with disclosed embodiments of the present disclosure.

Correspondingly, the present disclosure also provides a fabrication method of a display panel. FIG. 16 illustrates a schematic flowchart of a fabrication method of a display panel. Referring to FIG. 16, the method may include following.

In S101: providing a substrate.

In S102: forming a plurality of sub-pixels on the substrate. A sub-pixel may include a light-emitting element and a light-shielding structure corresponding to the light-emitting element. The plurality of sub-pixels may be divided into N types, and N may be an integer greater than or equal to two. For the light-emitting elements in the sub-pixels of different types, the light-shielding structures may be disposed in different directions of the corresponding light-emitting elements, such that the light-emitting directions of the sub-pixels of different types may be different.

The prepared display panel may refer to FIG. 1 and FIG. 2. The display panel in the present disclosure may allow the user to receive light emitted by sub-pixels of different types at different viewing angles without increasing the quantity of panels, which may lay the foundation for viewing different display images from different viewing angles. In other words, the display panel in the present disclosure may display multiple display images by a single display panel, which may facilitate to reduce the cost of multi-screen display, and to reduce the demands of multi-screen display for display space.

Figure 17:
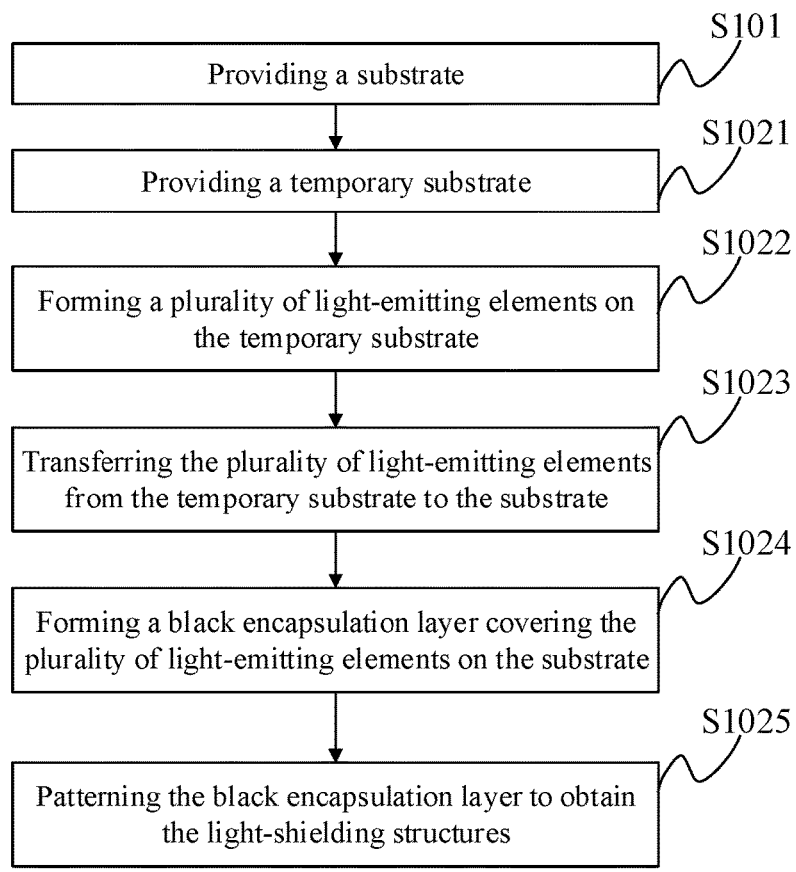
FIG. 17 illustrates a schematic flowchart of another exemplary fabrication method of a display panel consistent with disclosed embodiments of the present disclosure.

FIG. 17 illustrates a schematic flowchart of another fabrication method of a display panel. Referring to FIG. 17, forming the plurality of sub-pixels on the substrate may include following.

In S1021: providing a temporary substrate.

In S1022: forming a plurality of light-emitting elements on the temporary substrate.

In S1023: transferring the plurality of light-emitting elements from the temporary substrate to the substrate.

In S1024: forming a black encapsulation layer covering the plurality of light-emitting elements on the substrate.

In S1025: patterning the black encapsulation layer to obtain a plurality of light-shielding structures. When patterning the black encapsulation layer, a mask with different exposure regions for the light-emitting elements of sub-pixels of different types may need to be provided, such that the ultimately formed light-shielding structures in the sub-pixels of different types may have different directions with respect to corresponding light-emitting elements.

The preparation process of steps S1021-S1025 may refer to FIGS. 19-23. The preparation process illustrated in FIGS. 19-23 may not need to consider the placement direction of the light-emitting elements when transferring the light-emitting elements, which may facilitate to simplify the transfer process.

Figure 18:
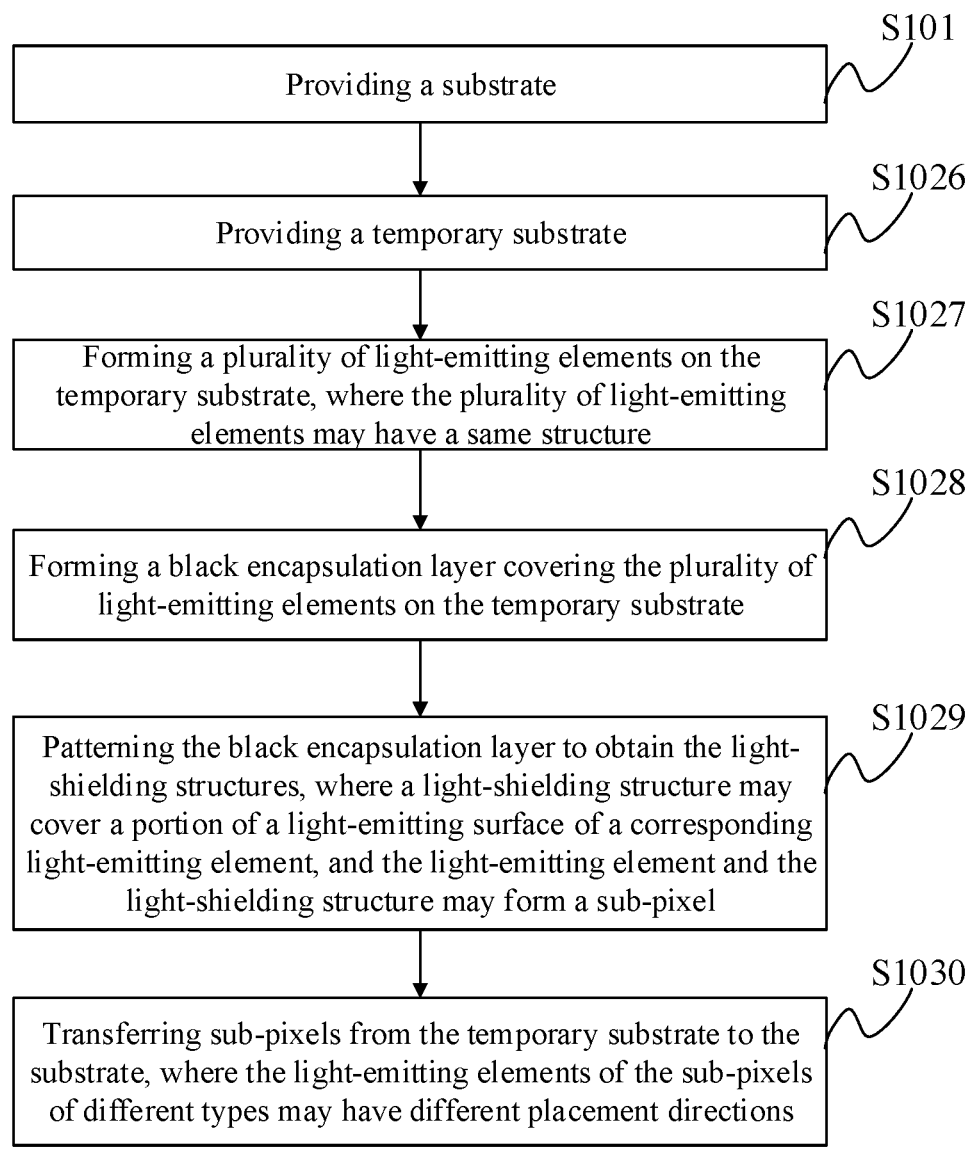
FIG. 18 illustrates a schematic flowchart of another exemplary fabrication method of a display panel consistent with disclosed embodiments of the present disclosure.

FIG. 18 illustrates a schematic flowchart of another fabrication method of a display panel. Referring to FIG. 18, forming the plurality of sub-pixels on the substrate may include following.

In S1026: providing a temporary substrate.

In S1027: forming a plurality of light-emitting elements on the temporary substrate, where the plurality of light-emitting elements may have a same structure.

In S1028: forming a black encapsulation layer covering the plurality of light-emitting elements on the temporary substrate.

In S1029: patterning the black encapsulation layer to obtain a plurality of light-shielding structures, where a light-shielding structure may cover a portion of a light-emitting surface of a corresponding light-emitting element, and the light-emitting element and the light-shielding structure may form a sub-pixel.

In S1030: transferring sub-pixels from the temporary substrate to the substrate, where the light-emitting elements of the sub-pixels of different types may have different placement directions.

Figure 19:
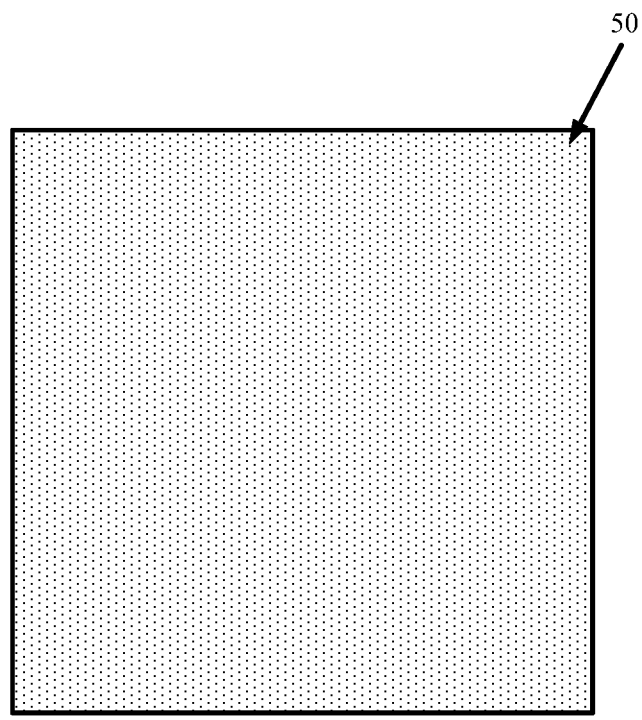
FIGS. 19-25 illustrate schematic diagrams of semiconductor structures corresponding to certain stages of an exemplary fabrication method of a display panel consistent with disclosed embodiments of the present disclosure.
Figure 20:
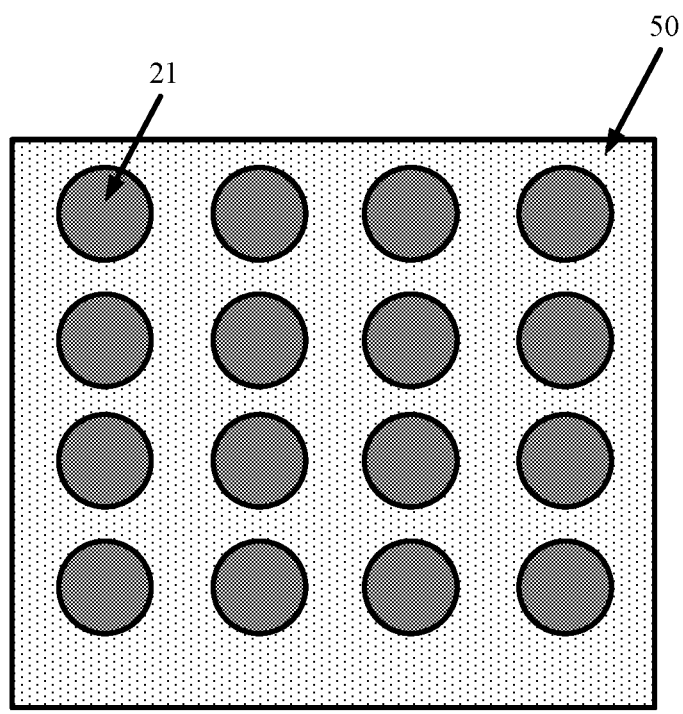
Figure 21:
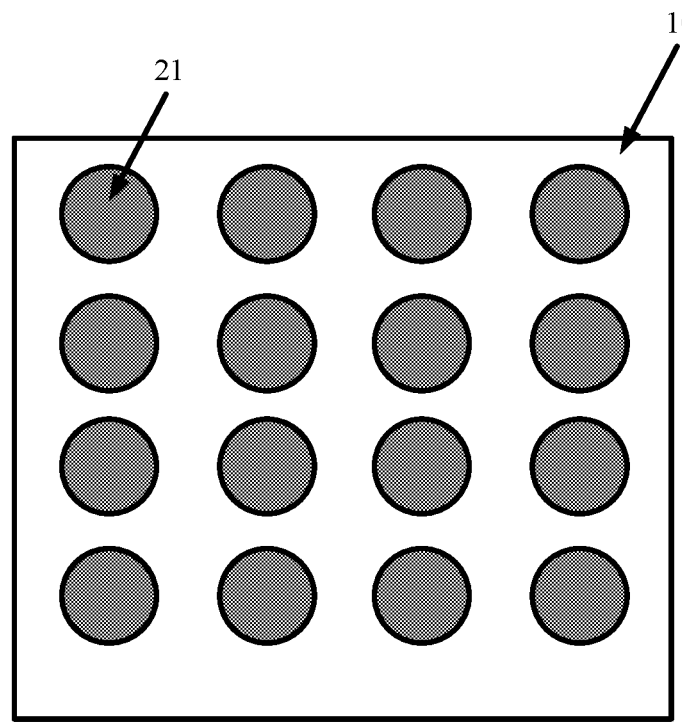
Figure 22:
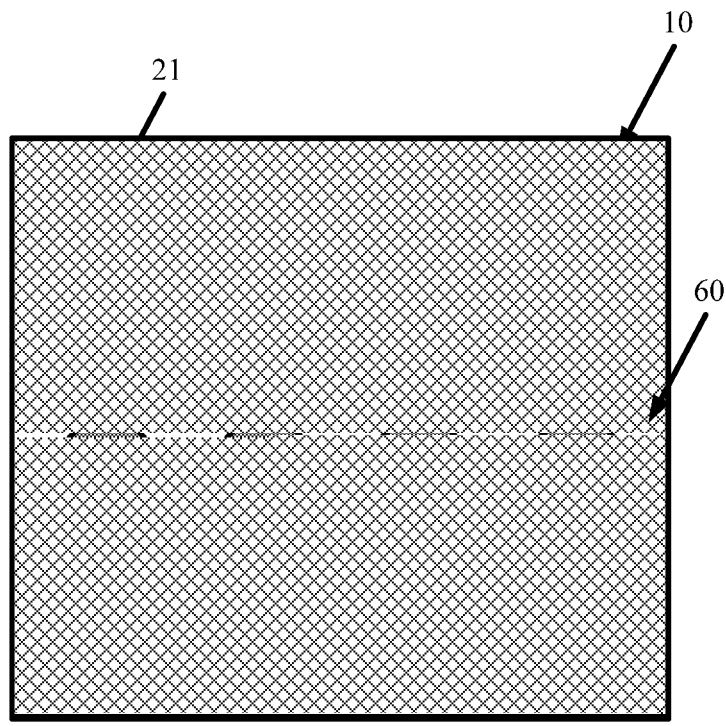
Figure 23:
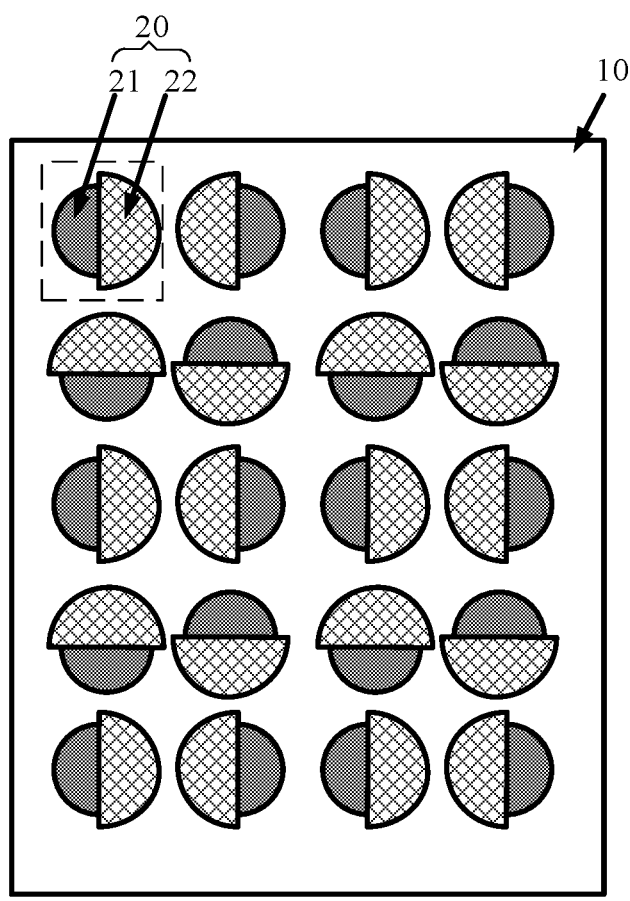
Figure 24:
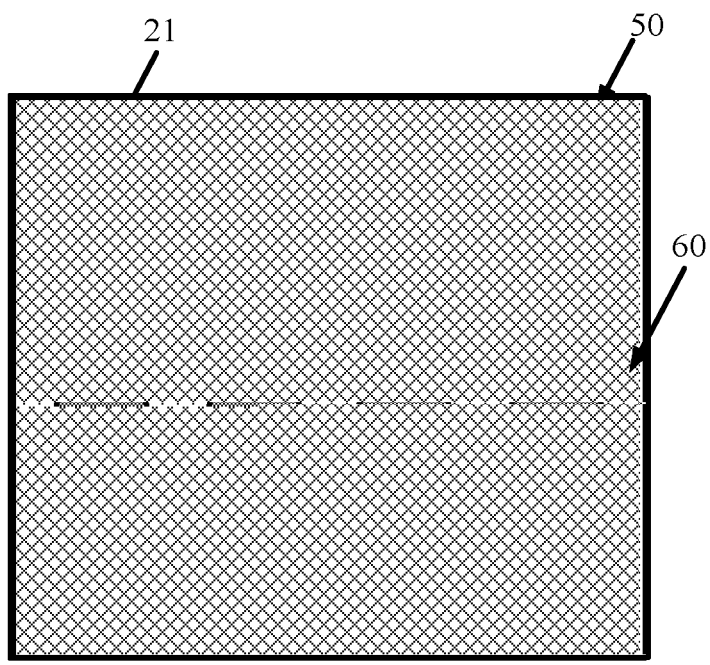
Figure 25:
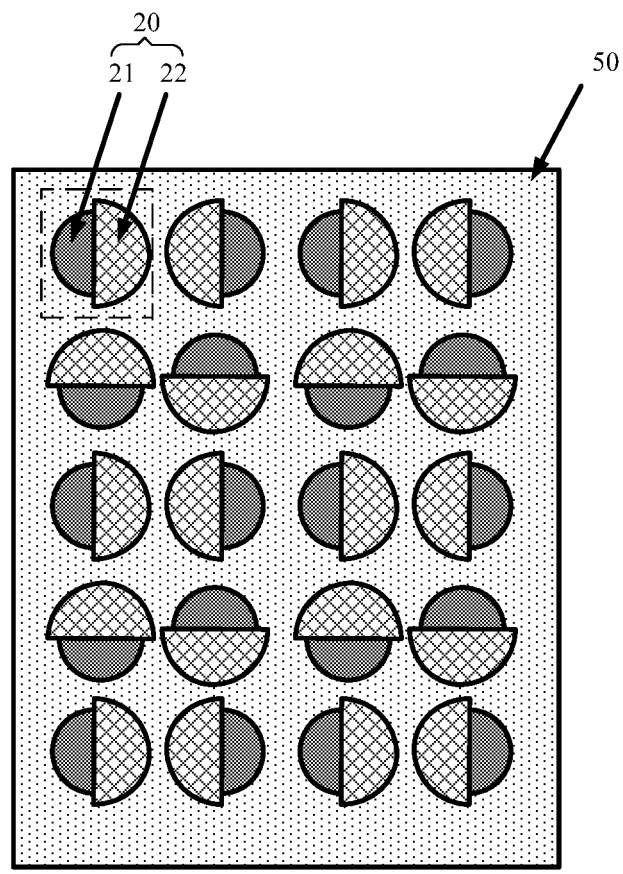

A top view structure of the temporary substrate may refer to FIG. 19. A top view of the temporary substrate and surface structures thereon after step S1027 may refer to FIG. 20. Preparation processes of steps S1028-S1029 may refer to FIGS. 24-25. In the preparation process of the sub-pixels in the disclosed embodiments associated with FIG. 18, the fabrication and patterning processes of the black encapsulation layer may not need to be performed on the substrate, which may facilitate to reduce the adverse effects of these processes on the existing film layers over the substrate.

In FIGS. 19-25, reference numeral 50 may represent the temporary substrate, reference numeral 21 may represent the light-emitting element, reference numeral 10 may represent the substrate, reference numeral 60 may represent the black encapsulation layer, and reference numeral 22 may represent the light-shielding structure. The light-emitting element may include but may not be limited to a light-emitting diode. The temporary substrate may include a hard substrates or a flexible substrates. The hard substrate may include but may not be limited to a glass substrates and an acrylic substrate, and the flexible substrate may include but may not be limited to a polyimide substrate.

Figure 26:
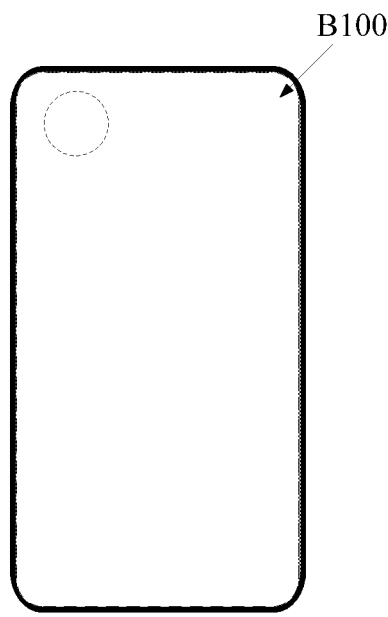
FIG. 26 illustrates a schematic diagram of an exemplary display device consistent with disclosed embodiments of the present disclosure.

Correspondingly, the present disclosure also provides a display device. FIG. 26 illustrates a schematic diagram of a display device. Referring to FIG. 26, the display device B100 may include the display panel provided in any of the above disclosed embodiments.

Accordingly, the present disclosure may provide a display panel and a fabrication method thereof, and a display device. The plurality of sub-pixels of the display panel may be divided into N types. For the sub-pixels of different types, the light-shielding structures may be disposed in different directions of the light-emitting elements of the sub-pixels, such that the light-emitting directions of the sub-pixels of different types may be different. Therefore, the display panel in the present disclosure may allow the user to receive light emitted by sub-pixels of different types at different viewing angles without increasing the quantity of panels, which may lay the foundation for viewing different display images by a single display panel, which may facilitate to reduce the cost of multi-screen display, and to reduce the demands of multi-screen display for display space.

The description of the disclosed embodiments is provided to illustrate the present disclosure to those skilled in the art. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments illustrated herein but is to be accorded the widest scope consistent with the principles and novel features disclosed herein.

What is claimed is:

1. A display panel, comprising:
a substrate; and
a plurality of sub-pixels disposed on the substrate, wherein:
each sub-pixel includes a light-emitting element and a light-shielding structure corresponding to the light-emitting element,
the plurality of sub-pixels are divided into N types, wherein N is an integer greater than or equal to two, and
for light-emitting elements in sub-pixels of different types of the plurality of sub-pixels, light-shielding structures are disposed on a same side of corresponding light-emitting elements away from the substrate but in different directions of the corresponding light-emitting elements, such that light-emitting directions of the sub-pixels of different types are different, wherein different light-emitting directions are directed to a same side of the display panel.

2. The display panel according to claim 1, wherein:
sub-pixels of a same type of the plurality of sub-pixels include light-emitting elements of different colors;
the sub-pixels of the same type jointly display one image; and
the sub-pixels of different types display different display images.

3. The display panel according to claim 1, wherein:
at least two sub-pixels that are of different types but emit light of a same color are adjacently disposed.

4. The display panel according to claim 1, wherein:
at least two sub-pixels that are of a same type but emit light of different colors are adjacently disposed.

5. The display panel according to claim 2, wherein:
in the sub-pixels of different types, an arrangement direction of the light-shielding structure with respect to the corresponding light-emitting element is parallel to a plane of the display panel.

6. The display panel according to claim 1, wherein:
the light-shielding structures include a first light-shielding structure and a second light-shielding structure;
the sub-pixels of different types at least include sub-pixels of a first-type and sub-pixels of a second-type;
each sub-pixel of the first-type includes a first light-emitting element and the first light-shielding structure, and each sub-pixel of the second-type includes a second light-emitting element and the second light-shielding structure; and
the first light-shielding structure is disposed on a side of the first light-emitting element along a first direction, and the second light-shielding structure is disposed on a side of the second light-emitting element along a second direction, wherein the first direction intersects the second direction.

7. The display panel according to claim 2, wherein:
the light-emitting elements of different colors in the sub-pixels of the same type together form a preset regular pattern; or
light-emitting elements of a same color in the sub-pixels of different types together form a preset regular pattern.

8. The display panel according to claim 1, wherein:
the substrate includes a display region, and
the sub-pixels of a same type are uniformly disposed in the display region.

9. The display panel according to claim 1, wherein:
light-emitting elements of the sub-pixels of different types have a same structure and different placement directions.

10. The display panel according to claim 1, wherein:
the sub-pixels of different types include sub-pixels of a first-type and sub-pixels of a second-type; and
a light-emitting element of a sub-pixel of the first-type and a light-emitting element of an adjacent sub-pixel of the second-type are symmetric with respect to a first axis, wherein the first axis is parallel to a surface of the substrate.

11. The display panel according to claim 1, wherein:
the light-shielding structure covers a portion of a top surface of the corresponding light-emitting element, wherein the top surface of the light-emitting element is a surface of the light-emitting element facing away from the substrate.

12. The display panel according to claim 11, wherein:
a ratio of an area of the portion of the top surface of the light-emitting element covered by the light-shielding structure over a total area of the top surface of the light-emitting element is in a range of approximately 0%-50%.

13. The display panel according to claim 11, wherein:
in a cross-section of the sub-pixel that is perpendicular to a surface of the substrate and perpendicular to a boundary line between the light-shielding structure and a top surface of the light-emitting element exposed by the light-shielding structure, a difference between a height of the light-shielding structure and a height of the light-emitting element, a length of a portion of the top surface of the light-emitting element exposed by the light-shielding structure, and a preset viewing angle meet a preset formula;
the height of the light-shielding structure includes a distance between a surface of the light-shielding structure facing away from the substrate and the substrate, the height of the light-emitting element includes a distance between the surface of the light-emitting element facing away from the substrate and the substrate, and the top surface of the light-emitting element includes the surface of the light-emitting element facing away from the substrate; and
the preset formula includes $$\tan\theta = \left|\frac{H}{L}\right|,$$

wherein θ represents the preset viewing angle, and the preset viewing angle is greater than 90°, H represents the difference between the height of the light-shielding structure and the height of the light-emitting element, and L represents the length of the portion of the top surface of the light-emitting element exposed by the light-shielding structure.

14. The display panel according to claim 1, wherein:
a height of the light-shielding structure is greater than a height of the light-emitting element; and
the height of the light-shielding structure includes a distance between a surface of the light-shielding structure facing away from the substrate and the substrate, and the height of the light-emitting element includes a distance between a surface of the light-emitting element facing away from the substrate and the substrate.

15. The display panel according to claim 14, wherein:
each sub-pixel further includes a reflection structure;
the light-shielding structure includes a first portion covering a sidewall of the light-emitting element, and a second portion above a top surface of the light-emitting element and facing towards a light-emitting surface of the display panel; and
the reflection structure at least covers a sidewall of the second portion facing towards the corresponding light-emitting element.

16. The display panel according to claim 15, wherein:
an end surface of the second portion of the light-shielding structure has a convex arc shape; and
the reflection structure includes an arc portion covering the end surface of the second portion of the light-shielding structure.

17. The display panel according to claim 11, wherein:
the top surface of the light-emitting element has a circular shape,
an orthographic projection of a portion of the light-shielding structure, covering the top surface of the light-emitting element, on the substrate has a semicircular shape, and
a portion of the light-emitting element exposed by the light-shielding structure has a semicircular shape.

18. A fabrication method of a display panel, comprising:
providing a substrate; and
forming a plurality of sub-pixels on the substrate, wherein:
 each sub-pixel includes a light-emitting element and a light-shielding structure corresponding to the light-emitting element,
 the plurality of sub-pixels are divided into N types, wherein N is an integer greater than or equal to two, and
 for light-emitting elements in sub-pixels of different types of the plurality of sub-pixels, light-shielding structures are disposed in on a same side of corresponding light-emitting elements away from the substrate but different directions of the corresponding light-emitting elements, such that light-emitting directions of the sub-pixels of different types are different, wherein different light-emitting directions are directed to a same side of the display panel.

19. The method according to claim 18, wherein forming the plurality of sub-pixels on the substrate includes:
providing a temporary substrate;
forming a plurality of light-emitting elements on the temporary substrate, wherein the plurality of light-emitting elements have a same structure;
forming a black encapsulation layer covering the plurality of light-emitting elements on the temporary substrate;
patterning the black encapsulation layer to obtain the light-shielding structures, wherein each light-shielding structure covers a portion of a light-emitting surface of the corresponding light-emitting element, and the light-emitting element and the light-shielding structure form a sub-pixel of the plurality of sub-pixels; and
transferring the plurality of sub-pixels from the temporary substrate to the substrate, wherein the light-emitting elements of the sub-pixels of different types have different placement directions.

20. A display device, comprising:
a display panel, the display panel including:
a substrate, and
a plurality of sub-pixels disposed on the substrate, wherein:
 each sub-pixel includes a light-emitting element and a light-shielding structure corresponding to the light-emitting element,
 the plurality of sub-pixels are divided into N types, wherein N is an integer greater than or equal to two, and
 for light-emitting elements in sub-pixels of different types of the plurality of sub-pixels, light-shielding structures are disposed on a same side of corresponding light-emitting elements away from the substrate but in different directions of the corresponding light-emitting elements, such that light-emitting directions of the sub-pixels of different types are different, wherein different light-emitting directions are directed to a same side of the display panel.

* * * * *